(12) United States Patent
Song et al.

(10) Patent No.: US 11,602,743 B2
(45) Date of Patent: Mar. 14, 2023

(54) METHODS FOR FABRICATING CARBON NANOTUBE ARRAYS WITH A HIGH STRUCTURAL FACTOR

(71) Applicants: Toyota Motor Engineering & Manufacturing North America, Inc., Plano, TX (US); Vanderbilt University, Nashville, TN (US)

(72) Inventors: Yuyang Song, Ann Arbor, MI (US); Shailesh N. Joshi, Ann Arbor, MI (US); Piran R. Kidambi, Nashville, TN (US); Peifu Cheng, Nashville, TN (US)

(73) Assignees: Toyota Motor Engineering & Manufacturing North America, Inc., Plano, TX (US); Vanderbilt University, Nashville, TN (US)

( * ) Notice: Subject to any disclaimer, the term of this patent is extended or adjusted under 35 U.S.C. 154(b) by 162 days.

(21) Appl. No.: 17/218,345

(22) Filed: Mar. 31, 2021

(65) Prior Publication Data
US 2022/0314211 A1 Oct. 6, 2022

(51) Int. Cl.
*B01J 37/02* (2006.01)
*B01J 21/18* (2006.01)
(Continued)

(52) U.S. Cl.
CPC .......... *B01J 37/0217* (2013.01); *B01J 21/04* (2013.01); *B01J 21/06* (2013.01); *B01J 21/185* (2013.01);
(Continued)

(58) Field of Classification Search
CPC .......... B01J 21/04; B01J 21/06; B01J 21/185; B01J 23/745; B01J 37/0217; B01J 37/08;
(Continued)

(56) References Cited

U.S. PATENT DOCUMENTS

2009/0111282 A1* 4/2009 Ward .................. C01B 32/16
257/E21.24
2010/0028613 A1 2/2010 Schmidt et al.
(Continued)

FOREIGN PATENT DOCUMENTS

KR 20020041496 A 6/2002
KR 20160144583 A 12/2016
(Continued)

OTHER PUBLICATIONS

Growth of conformal single-walled carbon nanotube films from Mo/Fe/Al2O3 deposited by electron beam evaporation (https://www.sciencedirect.com/science/article/abs/pii/S000862230500415X), Feb. 2006.
(Continued)

*Primary Examiner* — Brian A McCaig
(74) *Attorney, Agent, or Firm* — Dinsmore & Shohl LLP

(57) ABSTRACT

A method of fabricating a carbon nanotube ("CNT") array includes providing a substrate with a CNT catalyst disposed on a surface of the substrate, heating the CNT catalyst to an annealing temperature, exposing the CNT catalyst to a CNT precursor for an exposure period to pre-load the CNT catalyst, and exposing the pre-loaded CNT catalyst to a carbon source for a growth period to form the CNT array. The formed CNT array comprises a plurality of CNT bundles that are aligned with one another in an alignment direction. At least one of the plurality of bundles comprises an average structural factor of 1.5 or less along an entirety of the length thereof.

20 Claims, 10 Drawing Sheets

(51) Int. Cl.
  *B01J 37/08* (2006.01)
  *C23C 16/26* (2006.01)
  *B01J 23/745* (2006.01)
  *B01J 21/06* (2006.01)
  *B01J 21/04* (2006.01)

(52) U.S. Cl.
  CPC ............. *B01J 23/745* (2013.01); *B01J 37/08* (2013.01); *C23C 16/26* (2013.01)

(58) Field of Classification Search
  CPC ....... B01J 37/347; B01J 37/349; C23C 16/26; C01B 32/158
  See application file for complete search history.

(56) References Cited

U.S. PATENT DOCUMENTS

2010/0129549 A1　5/2010　Chan et al.
2012/0282453 A1　11/2012　Wang et al.

FOREIGN PATENT DOCUMENTS

WO　WO 2013/163493 A1 *　10/2013　.............. B01J 23/70
WO　　2016004191 A1　1/2016

OTHER PUBLICATIONS

Effect of different catalyst deposition technique on aligned multiwalled carbon nanotubes grown by thermal chemical vapor deposition (https://www.hindawi.com/journals/jnm/2014/707301/), Apr. 10, 2014.

* cited by examiner

METHODS FOR FABRICATING CARBON NANOTUBE ARRAYS WITH A HIGH STRUCTURAL FACTOR

TECHNICAL FIELD

The present specification generally relates carbon nanotubes and, more particularly to methods for fabricating carbon nanotube arrays with reduced levels of waviness.

BACKGROUND

Carbon nanotubes ("CNTs") are hollow tubes that are sheets of carbon atoms forming a graphitic hexagonal carbon lattice. CNTs have attracted much interest in recent years due to their exception thermal, mechanical, and electrical properties. CNTs are suitable for many applications requiring high strength, durability, electrical conductivity, and thermal conductivity. For example, CNTs are attractive replacements for existing metallic structures in many instances because they are relatively lightweight and chemically stable. Existing methods for fabricating arrays of CNTs, however, suffer from various deficiencies, such as inconsistencies in density, length, and alignment of CNTs that they produce. An example of one such deficiency associated with existing fabrication methods relates to the straightness of the resultant CNTs. For example, existing fabrication methods may not grow CNTs along straight growth lines, resulting in a wavy structure. Such waviness may lead to various degradations in performance.

Accordingly, a need exists for an improved fabrication method for fabricating CNT arrays with less wavy CNTs.

SUMMARY

An embodiment of the present disclosure relates to a method of fabricating a carbon nanotube ("CNT") array includes providing a substrate with a CNT catalyst disposed on a surface of the substrate, heating the CNT catalyst to an annealing temperature, exposing the CNT catalyst to a CNT precursor for an exposure period to pre-load the CNT catalyst, and exposing the pre-loaded CNT catalyst to a carbon source for a growth period to form the CNT array. The formed CNT array comprises a plurality of CNT bundles that are aligned with one another in an alignment direction. At least one of the plurality of bundles comprises an average structural factor of 1.5 or less along an entirety of the length thereof.

Another embodiment of the present disclosure relates to a method of fabricating a carbon nanotube ("CNT") array. The method includes inserting a CNT catalyst structure into a heating zone of a chemical vapor deposition ("CVD") chamber. The CNT catalyst structure includes a silicon substrate; a catalyst support layer disposed on the substrate; and a CNT catalyst layer disposed on the catalyst support layer. The method also includes annealing the CNT catalyst layer to form a plurality of catalyst particles on the catalyst support layer by maintaining the CNT catalyst at an annealing temperature for an annealing period. During the annealing of the CNT catalyst, the method includes pre-loading the CNT by introducing a CNT precursor into the CVD chamber at a first flow rate for an exposure period. After the pre-loading, the method includes exposing the CNT catalyst to the CNT precursor at a second flow rate for a growth period of at least 20 minutes, the second flow rate being greater than the first flow rate. The exposure of the CNT catalyst to the CNT precursor at the second flow rate results in the formation of a plurality of CNT bundles having a structural factor of less than or equal to 1.5 throughout entireties of the length thereof.

Another embodiment of the present disclosure relates to a carbon nanotube (CNT) array including a plurality of CNT bundles disposed on a substrate. The plurality of CNT bundles are aligned with one another in an alignment direction. Ends of each of the plurality of CNT bundles are separated from one another by a CNT array height measured along the alignment direction. Each of the plurality of CNT bundles comprises a structural factor that is less than or equal to 1.5 along an entirety of a thickness of the CNT array.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Figure 1:
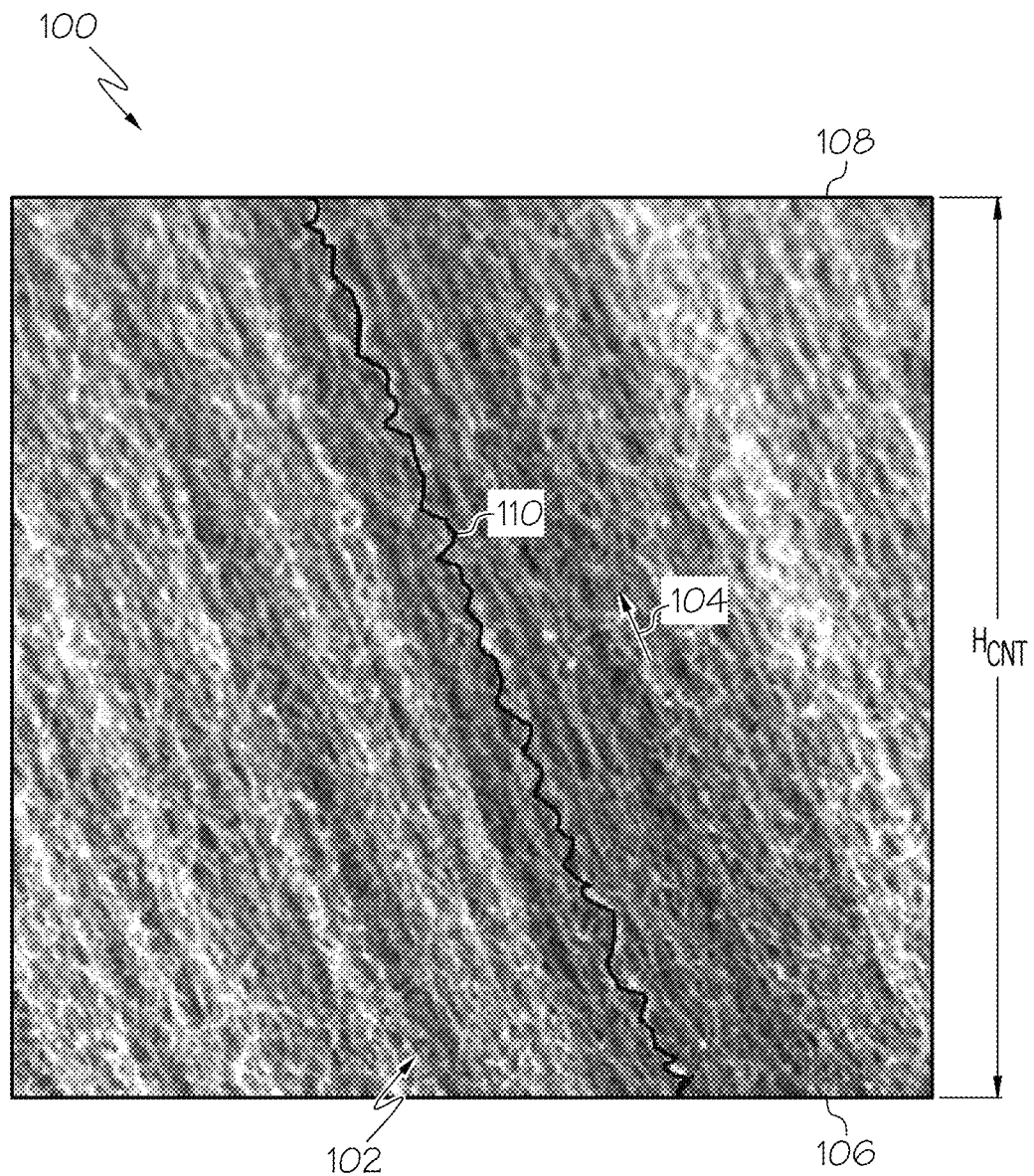
FIG. 1 depicts an image of a carbon nanotube (CNT) array including a plurality of CNT bundles aligned with one another in an alignment direction and having a CNT array height, according to one or more embodiments described herein.

Referring generally to the figures, embodiments of the present disclosure are directed to carbon nanotube (CNT) arrays including CNT bundles with relatively low structural factors and methods for fabricating the same. The CNT arrays may be fabricated on a surface of a substrate by exposing a CNT catalyst disposed thereon to a carbon source (e.g., ethylene, methane, or the like) for a growth period at suitable growth conditions to facilitate self-organization and growth of a plurality of CNT bundles in an alignment direction from the CNT catalyst. Growth of the CNTs in the alignment directions may continue until the CNT catalyst deactivates, resulting in the CNT bundles possessing a CNT array height in the alignment direction. Prior to the growth of the CNT arrays, the CNT catalyst may be pre-treated by exposing the CNT catalyst to a carbon source while the CNT catalyst is heated to an elevated temperature to pre-load the CNT catalyst. Such preloading may facilitate the growth of relatively straight carbon nanotubes. That is, the pre-treatments of the CNT catalyst described herein may result in growth lines of the CNT bundles deviating from straight lines extending in the alignment direction between first ends of the CNT bundles disposed on the substrate and second ends of the CNT bundles by less than CNT fabrication methods not including such catalyst pre-treatments. In embodiments, the CNT arrays fabricated in accordance with the methods described herein may include CNT bundles having structural factors less than or equal to 1.5 (e.g., less than or equal to 1.4, less than or equal to 1.3, less than or equal to 1.2, less than or equal to 1.1, less than or equal to 1.05) throughout entireties of the lengths thereof, whereas existing fabrication methods may result in CNT bundles with structural factors of 2.0 or even higher (e.g., greater than equal to 4.0). Such improved straightness may result in CNT array having improved material properties, such as strength and thermal conductivity.

In addition to providing CNTs with relatively low waviness, the fabrication methods described herein may also be tailored to fabricate CNTs with relatively large CNT array heights and densities. In embodiments, for example, the CNT catalyst may be disposed on a catalyst support layer deposited on the surface of the substrate. The catalyst support layer may be formed on the substrate by e-beam evaporation to facilitate the CNT catalyst having properties (e.g., grain distribution, grain size, and the like) favorable for fabrication of relatively long CNT bundles (or CNT arrays having relatively large CNT array heights) of 1.2 mm or more (e.g., greater than or equal to 1.2 mm, greater than or equal to 1.3 mm, greater than or equal to 1.4 mm, greater than or equal to 1.5 mm). Moreover, the CNT catalyst pre-treatments described herein may be tailored by altering the flow rate and exposure time to yield relatively dense CNT arrays. As described herein, the CNT catalyst pre-treatments may include exposing the CNT catalyst to $C_2H_4$ at a flow rate of 0.05 sccm to 10.0 sccm (e.g., from 0.5 sccm to 1.0 sccm) for an exposure period of 10 minutes to 30 minutes to fabricate CNT arrays with CNT densities of greater than or equal to 15 $\mu g/mm^3$ (e.g., greater than 20 $\mu g/mm^3$). Thus, the fabrication methods described herein are capable of fabricating high yield CNT arrays with relatively low CNT waviness and relatively large CNT heights, leading to favorable material properties like tensile strength and thermal/electrical conductivity.

As used herein, the term "structural factor" refers to a ratio of a length of a CNT growth line to a CNT array height. For example, FIG. 1 depicts an image of a portion of a CNT array 100. The depicted portion of the CNT array 100 comprises a plurality of CNT bundles 102 (groupings of individual CNTs) that are generally aligned with one another in an alignment direction 104. That is, lines connecting first ends of each of the plurality of CNT bundles 102 at a first surface 106 of the CNT array 100 (e.g., disposed on a substrate, not depicted in FIG. 1) to second ends of each of the plurality of CNT bundles 102 at a second surface 108 of the CNT array 100 extend generally parallel to one another in the alignment direction 104. The lengths of such lines extending between the ends of the plurality of CNT bundles 102 in the alignment direction have lengths corresponding to a CNT array height $H_{CNT}$. That is, as used herein, the term "CNT array height" refers to the length of a straight line connecting ends of a particular CNT bundle of a CNT array (or ends of a portion or segment of a CNT bundle).

As depicted in FIG. 1, one of the plurality of CNT bundles 102 includes a growth line 110. The growth line 110 follows the growth path of a particular CNT of the CNT bundle. For example, nanoparticles of a CNT catalyst may nucleate during a growth process of the CNT bundle, and carbon atoms may subsequently accumulate on the nucleated nanoparticles to form CNTs along the growth line 110. As a result of complex intermolecular interactions during the growth process, the growth line 110 is not a straight line, but rather has a certain quantity of waviness between the first surface 106 and the second surface 108. The actual length of a the growth line 110 divided by the CNT array height $H_{CNT}$ provides the structural factor for a particular CNT. When used to describe a plurality of CNTs (e.g., a CNT bundle or a plurality of CNT bundles), the term "structural factor" refers to an average of the structural factors of each individual CNT. Structural factors may be measured by capturing an image of a CNT array and using image processing techniques to determine actual lengths of individual CNTs along growth lines thereof and divide such growth line lengths by the CNT array height.

Figure 2A:
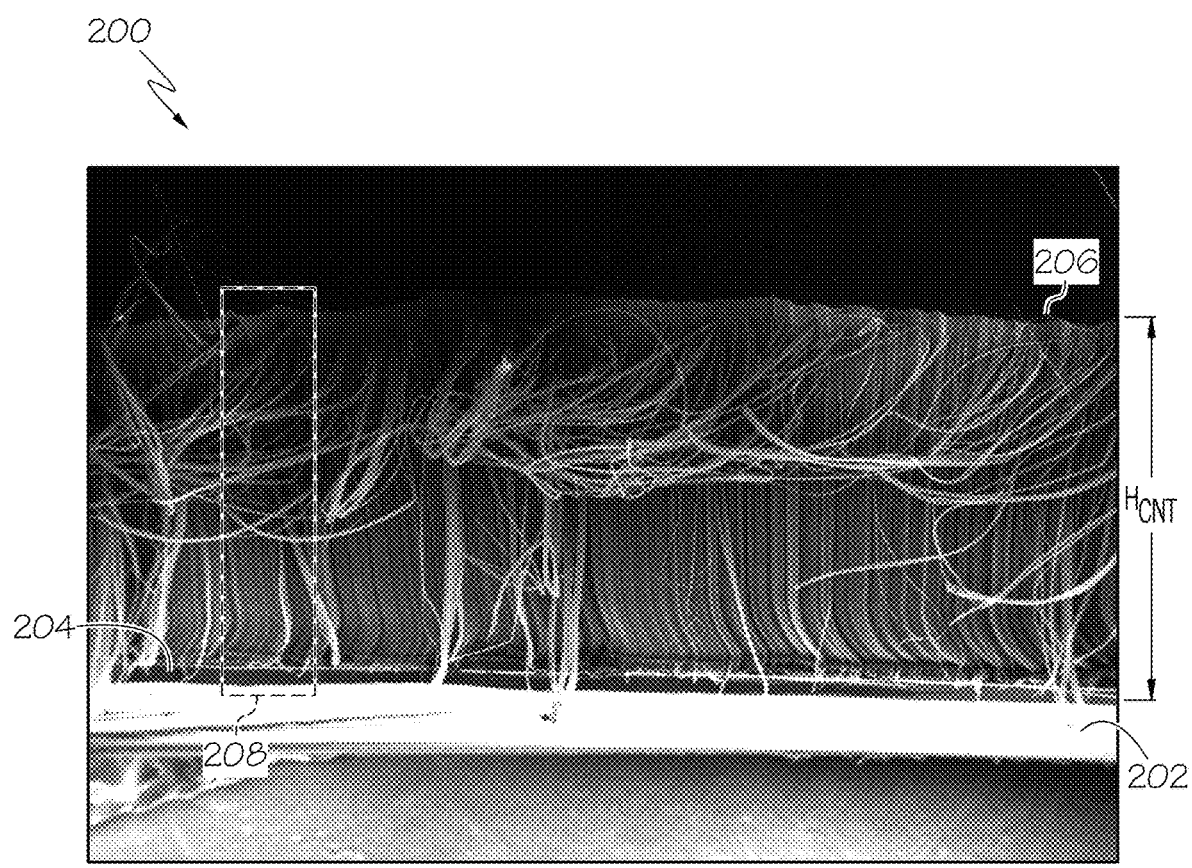
FIG. 2A depicts an image of a CNT array, according to one or more embodiments described herein.

As will be appreciated, CNT arrays may include structural variability leading to different portions of a CNT array having different structural factors. FIG. 2A depicts a CNT array 200 disposed on a substrate 202. The CNT array 200 includes a plurality of CNTs that are generally aligned perpendicular to a surface 204 of the substrate 202 (i.e., the alignment direction is perpendicular to the surface 204). The plurality of CNTs of the CNT array 200 include first ends at the surface 204 and second ends defining a second surface 206. The distance between the surface 204 of the substrate 202 and the second surface 206 defines a CNT array height $H_{CNT}$ of approximately 1 mm. As depicted, the straightness of the CNTs is highly dependent on location, with the CNTs generally being straighter with increasing distance from the substrate 202.

Figure 2C:
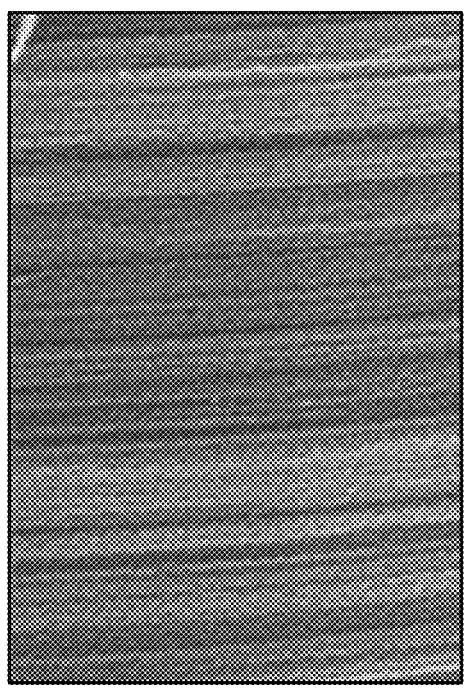
FIG. 2C depicts an image of a second lengthwise segment of a portion of the CNT array depicted in FIG. 2A, the second lengthwise segment including a plurality of CNT bundles with a second structural factor, according to one or more embodiments described herein.
Figure 2E:
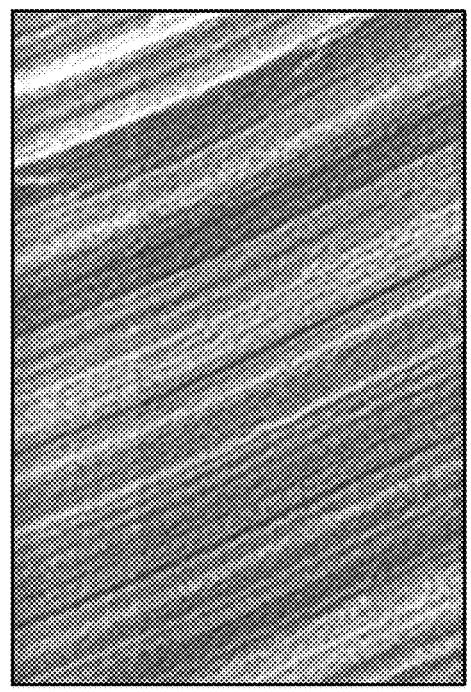
FIG. 2E depicts an image of a fourth lengthwise segment of a portion of the CNT array depicted in FIG. 2A, the fourth lengthwise segment including a plurality of CNT bundles with a fourth structural factor, according to one or more embodiments described herein.
Figure 2B:
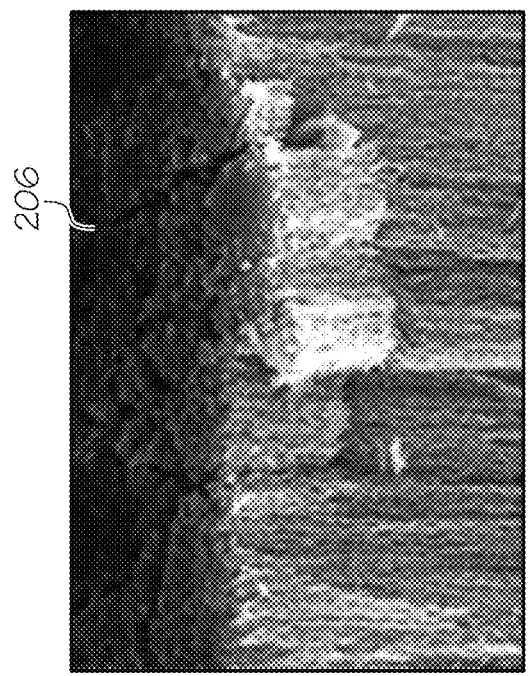
FIG. 2B depicts an image of a first lengthwise segment of a portion of the CNT array depicted in FIG. 2A, the first lengthwise segment including a plurality of CNT bundles with a first structural factor, according to one or more embodiments described herein.
Figure 2D:
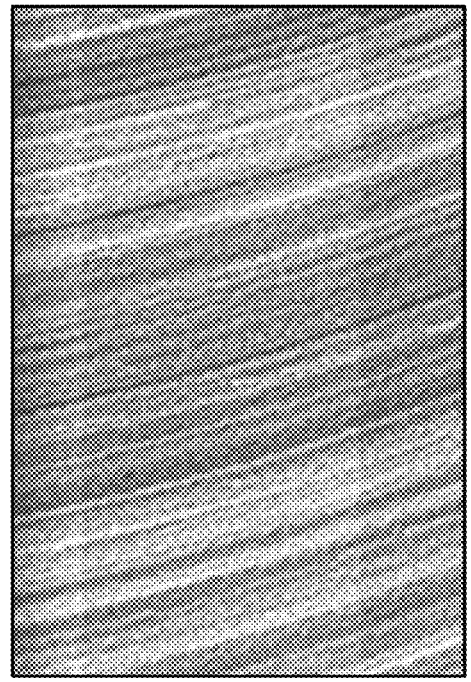
FIG. 2D depicts an image of a third lengthwise segment of a portion of the CNT array depicted in FIG. 2A, the third lengthwise segment including a plurality of CNT bundles with a third structural factor, according to one or more embodiments described herein.
Figure 2F:
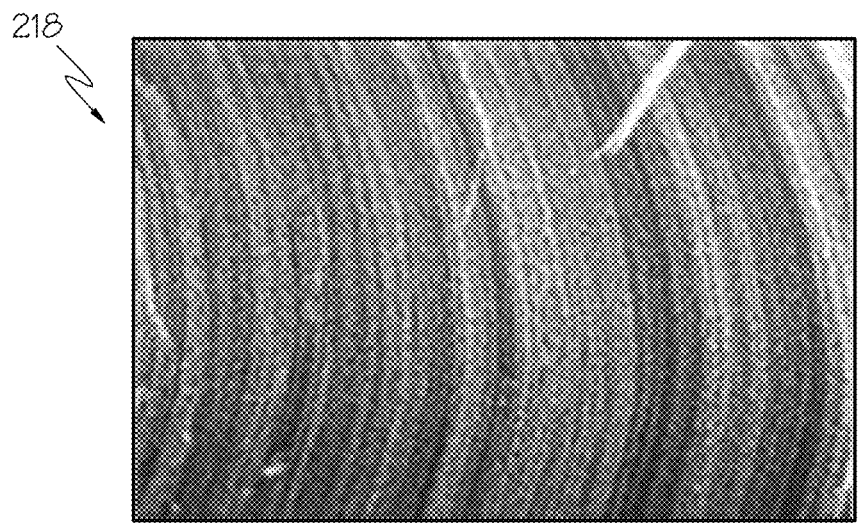
FIG. 2F depicts an image of a fifth lengthwise segment of a portion of the CNT array depicted in FIG. 2A, the fifth lengthwise segment including a plurality of CNT bundles with a fifth structural factor, according to one or more embodiments described herein.
Figure 2G:
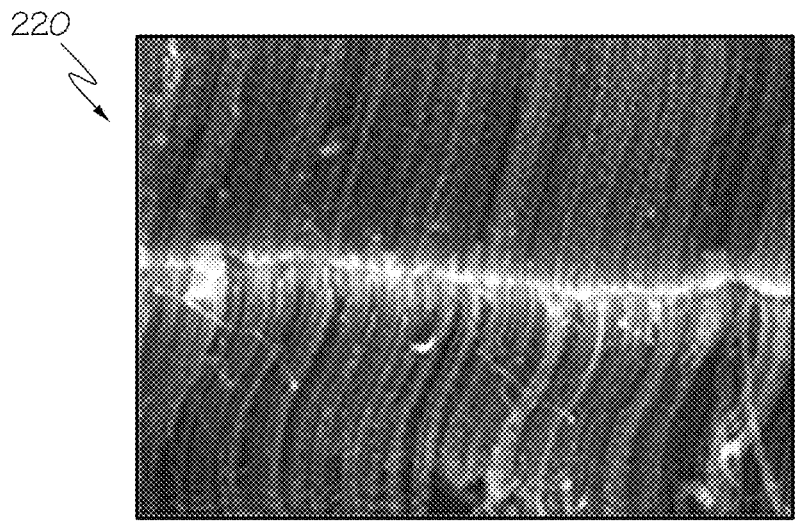
FIG. 2G depicts an image of a sixth lengthwise segment of a portion of the CNT array depicted in FIG. 2A, the sixth lengthwise segment including a plurality of CNT bundles with a sixth structural factor, according to one or more embodiments described herein.
Figure 2H:
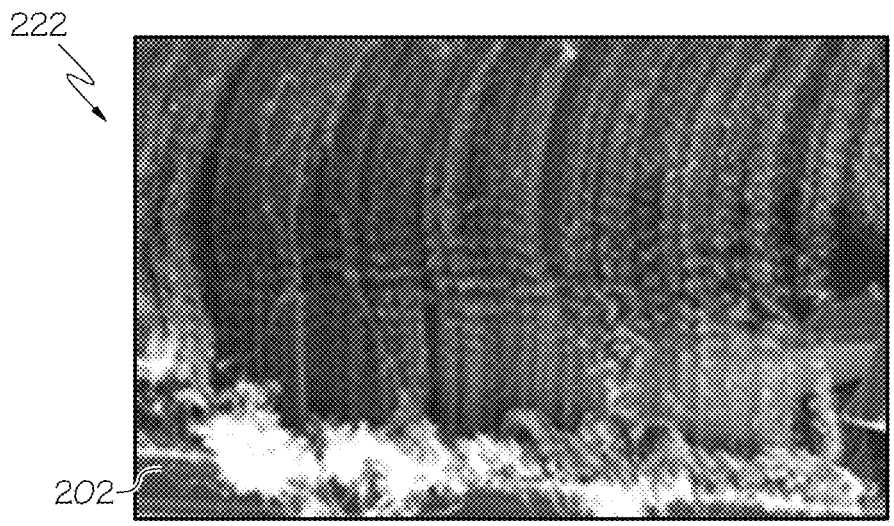
FIG. 2H depicts an image of a seventh lengthwise segment of a portion of the CNT array depicted in FIG. 2A, the seventh lengthwise segment including a plurality of CNT bundles with a seventh structural factor, according to one or more embodiments described herein.

FIGS. 2B-2H depict close-up views of a plurality of segments of the portion of the CNT array 200 contained in the region 208 depicted in FIG. 2A. FIG. 2B depicts an image of an upper segment 210 of the CNT array 200 extending from the second surface 206. The CNTs in the upper segment 210 were imaged and determined to have an average structural factor of 1.3. FIG. 2C depicts an image of another segment 212 of the CNT array 200. The CNTs in the segment 212 were imaged and determined to have an average structural factor of 1.2. FIG. 2D depicts an image of another segment 214 of the CNT array 200. The CNTs in the segment 214 were imaged and determined to have an average structural factor of 1.4. FIG. 2E depicts an image of another segment 216 of the CNT array 200. The CNTs in the segment 216 were imaged and determined to have an average structural factor of 1.5. FIG. 2F depicts an image of another segment 218 of the CNT array 200. The CNTs in the segment 218 were imaged and determined to have an average structural factor of 2.4. FIG. 2G depicts an image of another segment 220 of the CNT array 200. The CNTs in the segment 220 were imaged and determined to have an average structural factor of 3.0. FIG. 2H depicts an image of lower segment 222 of the CNT array 200 extending from the substrate 202. The CNTs in the segment 214 were imaged and determined to have an average structural factor of 4.5.

The structural factor of the CNT array 200 thus varies by 450% in the region 208, depending on the lengthwise segment in which the measurement is taken. Other regions of the CNT arrays 200 have similar structural factor magnitudes and variabilities. Such waviness and variability in structural factor may cause the CNT array 200 to have non-uniform material properties that are unfavorable for certain applications. For example, the structural factors described above may lead to relatively low thermal and electrical conductivities by inhibiting electron flow. The tensile strength of the CNT array 200 may also be adversely affected by the structural factor variability.

Figure 3:
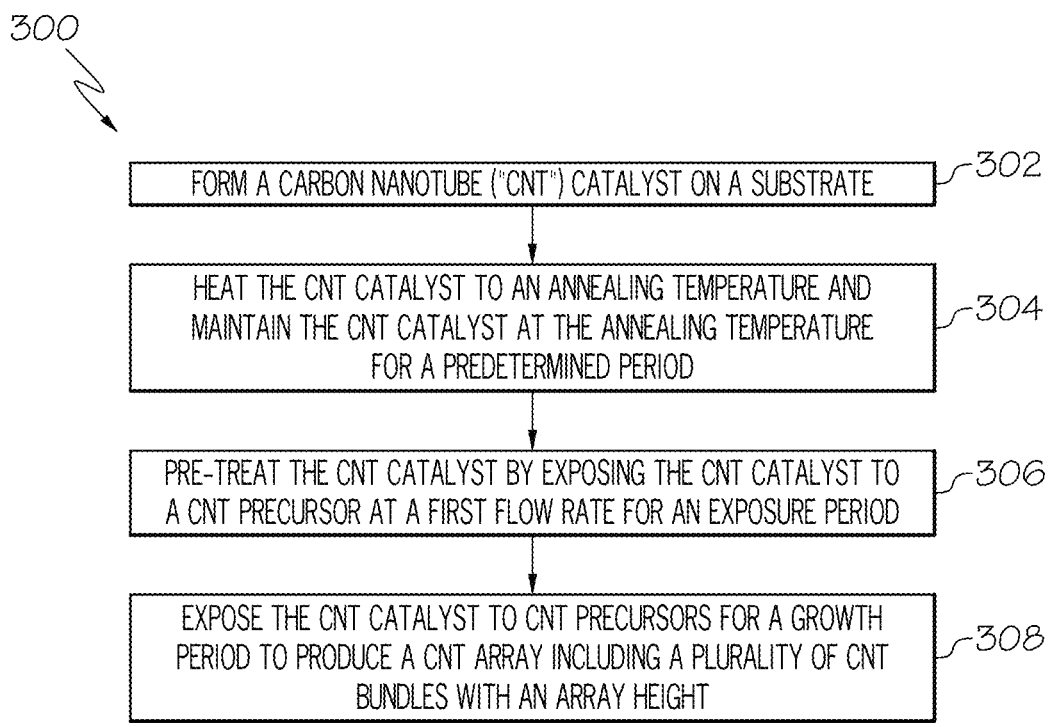
FIG. 3 depicts a flow diagram of a method of fabricating a CNT array, according to one or more embodiments described herein.

FIG. 3 depicts a flow diagram of a method 300 for fabricating a CNT array having improved structural qualities over the example described herein with respect to FIGS. 2A-2H. In embodiments, performance of the method 300 may lead to the production of CNT arrays with aligned carbon nanotubes possessing relatively low structural factors. For example, in embodiments, performance of the method 300 described herein may result in the fabrication of CNT arrays comprising a plurality of CNT bundles with average structural factors of less than or equal to 1.5 along the entirety of the lengths thereof. In addition to the relatively low in magnitude as compared with the example described above with respect to FIGS. 2A-2H, the structural factors of the CNT bundles fabricated via performance of the method 300 may also have relatively low variabilities. For example, in embodiments, the structural factors of the CNT bundles fabricated using the method 300 may vary by 20% or less of a minimum measured structural factor (e.g., determined by measuring a structural factor of a plurality of lengthwise segments of a portion of the CNT array, as described above with respect to FIGS. 2B-2H). The CNT arrays generated by the method 300 thus possess relatively low waviness as compared to CNT arrays, which may result in improved material properties.

At block 302, a CNT catalyst is formed on a substrate. In embodiments, the substrate is constructed of silicon or silica and comprises a first thickness. In embodiments, the first thickness is greater than or equal to 100 nm (e.g., 200 nm, 300 nm. 400 nm, etc.), with the understanding that the selected thickness may differ depending on the application. In embodiments, the catalyst layer is a metallic layer having a second thickness that is less than the first thickness of the substrate. For example, in embodiments, the second thickness is less than or equal to 10 nm (e.g., 1 nm). The success in forming a CNT array with desired properties is dependent on the construction of the CNT catalyst (or catalyst layer). Grain distribution and density of the catalyst layer on the substrate determines nucleation locations for CNT growth and ultimately effects the arrangement and structure of the resultant CNT array. The catalyst selected may also determine whether the CNTs grown during the method 300 are single walled CNTS or multi-walled CNTs. In embodiments, the CNT catalyst comprises a layer constructed of Fe to facilitate the growth of multi-walled CNTs.

Figure 4A:
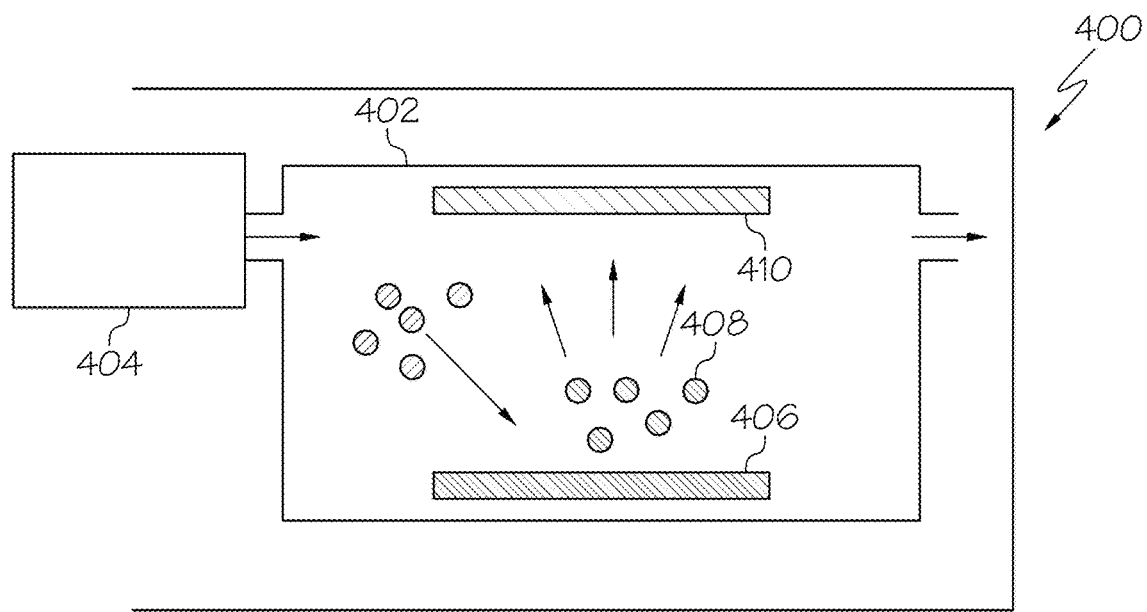
FIG. 4A schematically depicts a magnetron sputtering deposition apparatus that may be used to form catalyst structures in the method depicted in FIG. 3, according to one or more embodiments described herein.
Figure 4B:
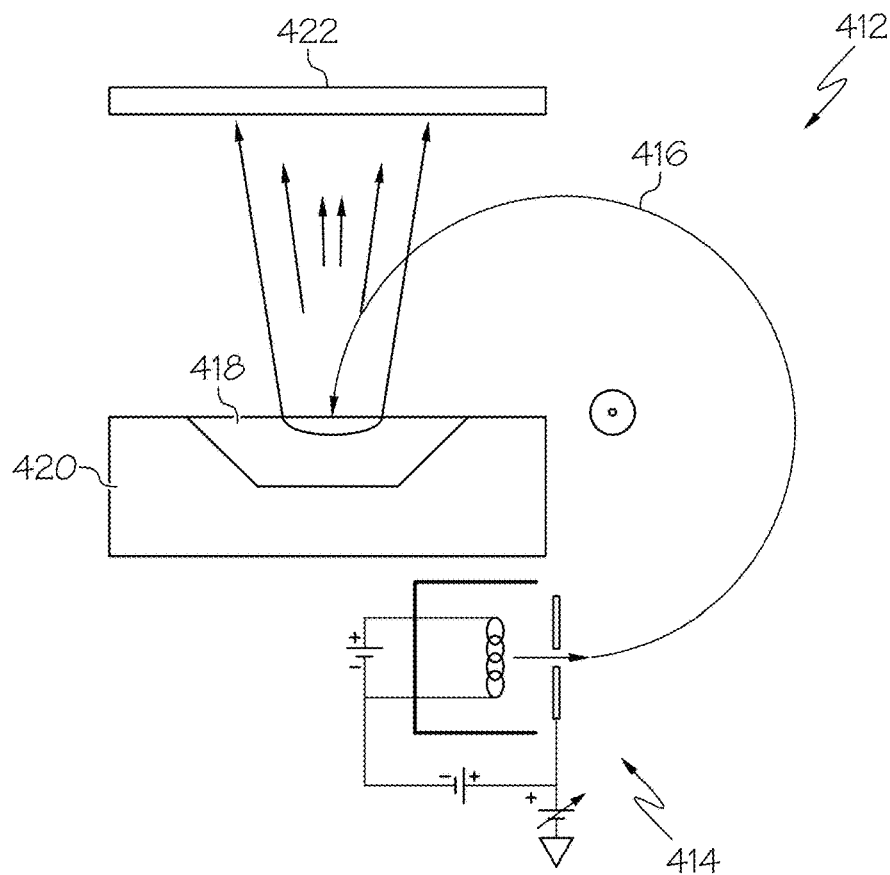
FIG. 4B schematically depicts an electron beam evaporation apparatus that may be used to form catalyst structures in the method depicted in FIG. 3, according to one or more embodiments described herein.

Properties of the CNT catalyst are also dependent on the manner with which the CNT catalyst is formed on the substrate, with the understanding the that more uniform CNT catalysts may result in CNT arrays having certain favorable qualities (e.g., CNT length and density). Depending on the implementation, the CNT catalyst may be deposited on the substrate via physical deposition methods (e.g., magnetron sputtering, e-beam evaporation), chemical methods (e.g., chemical vapor deposition), or coating methods (e.g., spin coating, dip coating, or contact printing). FIGS. 4A and 4B depict example physical deposition methods that may be used to form the CNT catalyst. FIG. 4A depicts a magnetron sputtering apparatus 400 in which a substrate 410 is disposed on a sputtering chamber 402 disposed in an electromagnetic field. A sputtering gas source 404 is in fluid communication with the sputtering chamber 402 and emits an inert sputtering gas into the sputtering chamber 402. Electrons from the electromagnetic fields undergo ionizing collisions with the sputtering gas, leading to a plasma. The plasma is guided via the electromagnetic field into the sputtering target 406, which may be constructed of the material desired to form the CNT catalyst. Bombardment of the sputtering target 406 via the plasma ejects catalyst atoms 408 into the sputtering chamber 402, which are coated onto the substrate 410. In embodiments, the sputtering chamber 402 may be heated to a deposition temperature and the sputtering gas source 404 may be controlled to maintain the pressure within the sputtering chamber 402 at a suitable value. Such factors may affecting the grain size and density of the resultant CNT catalyst layer disposed on the substrate, leading to downstream effects in the length, diameter, and density of the resultant CNT arrays.

FIG. 4B depicts a e-beam evaporation apparatus 412, which includes an electron beam source 414 (e.g., a filament or the like) disposed in a vacuum environment in which a magnetic field propagates. The magnetic field causes an electron beam 416 emitted from the electron beam source 414 to bombard a target (depicted as an ingot 418). The electron beam 416 heats the ingot 418, causing atoms therein to transform into a gaseous phase that coats a thin layer of the material of the ingot 418 on a substrate 422. The e-beam evaporation technique depicted in FIG. 4B may be preferable over the sputtering depicted in FIG. 4A, as e-beam evaporation may result in more uniform catalyst deposition and longer, more dense CNT arrays.

Referring back to FIG. 3, interactions between the CNT catalyst and the substrate may adversely affect CNT growth. For example, in embodiments, the substrate and CNT catalyst may react at elevated deposition temperatures that may lead to de-activation of the CNT catalyst and hindrance of CNT growth. As such, in embodiments, prior to performance of the block 302, a catalyst support layer may be disposed on the substrate. The catalyst support layer may prevent chemical interactions between the CNT catalyst and the catalyst support layer and facilitate growth of longer, more dense CNT arrays. Interactions between such a catalyst support layer and the CNT catalyst ultimately deposited thereon may promote or hinder CNT growth by affecting the distribution and grain size of the CNT catalyst. As such, the particular material out of which the catalyst support layer is constructed may depend on the metal selected for the CNT catalyst. One beneficial support layer/CNT catalyst combination that was identified was an $Al_2O_3$ support layer and a Fe CNT catalyst. The presence of oxygen in the catalyst may prevent amalgamation of the CNT catalyst into larger nanoparticles, which may facilitate a uniform catalyst distribution on the substrate and promote dense CNT growth. Other catalyst support layer/CNT catalyst combinations are contemplated and within the scope of the present disclosure.

At block 304, after the CNT catalyst is deposited on the substrate, the CNT catalyst is heated to an annealing temperature. During the heating, the CNT catalyst may be heated at a predetermined heating rate while the CNT catalyst is placed in an inert atmosphere (e.g., in which inert gases such as argon are introduced to the chamber containing the CNT catalyst). Once the heating stage is complete, the CNT catalyst may be maintained at the annealing temperature for a predetermined annealing period. In embodiments, the annealing temperature is greater than or equal to 700° C. (e.g., greater than or equal to 750° C., greater than or equal to 775° C., greater than or equal to 800° C.) and the annealing period is at least 10 minutes (e.g., greater than or equal 15 minutes, greater than or equal to 30 minutes). In embodiments, while the CNT substrate is maintained at the annealing temperature, the CNT substrate is exposed to a reduced atmosphere (e.g., in which gases such as helium and hydrogen are introduced into the chamber). Maintenance of the CNT catalyst at such elevated temperatures may facilitate the CNT catalyst layer previously deposited on the substrate breaking up to form a plurality of nanoparticles that serve as a basis for subsequent CNT growth. As described herein, the grain size and distribution of such nanoparticles may determine the resultant structure of the CNT array, and are affected by the structure of the substrate, catalyst support layer, and CNT catalyst.

Figure 5:
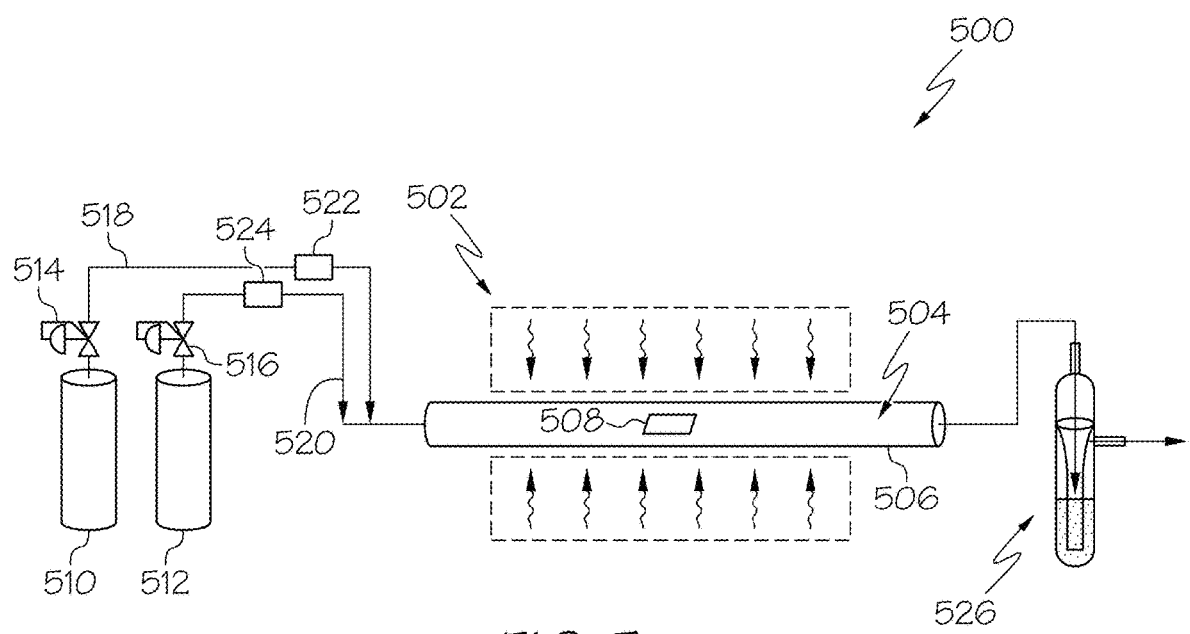
FIG. 5 schematically depicts a chemical vapor deposition apparatus that may be used to fabricate CNTs via the method depicted in FIG. 3, according to one or more embodiments described herein.

In embodiments, the heating of the CNT catalyst occurs within a deposition system where the CNTs are grown on the CNT catalyst. FIG. 5 depicts a chemical vapor deposition apparatus 500 that may be used during the performance of the method 300. The chemical vapor deposition apparatus 500 includes a heating unit 502, shown as a split tube furnace. The heating unit 502 includes a plurality of heating elements to maintain the temperature within a heating zone 504 at a desired level. A substrate 508 (e.g., having a catalyst support layer and CNT catalyst disposed thereon) is disposed within the heating zone 504. In embodiments, a substrate holder (not depicted) maintains the substrate 508 within the heating zone 504 at a desired orientation. In embodiments, the substrate 508 may be held such that the CNT catalyst faces upward (e.g., in the positive y-direction depicted in FIG. 5) such that the force of gravity is in the opposite direction of the CNT catalyst. In embodiments, the CNT catalyst faces downward (e.g., in the negative y-direction), in the same direction as gravity.

The heating unit 504 defines a deposition chamber 506 in which heating of the substrate 508 and subsequent CNT growth takes place. The deposition chamber 506 is in fluid communication with a first supply line 518 and a second supply line 520. The first and second fluid supply lines 518 and 520 are fluidly connected to CNT precursor sources 510 and 512 containing gases that are provided into the deposition chamber 506 during performance of the method 300. A first valve 514 is configured to start and stop flow of a first CNT precursor from the CNT precursor source 510 into the deposition chamber 506. A second valve 516 is configured to start and stop flow of a second CNT precursor from the CNT precursor source 512 into the deposition chamber 506. Mass flow controllers 522 and 524 may control the flow rates of the CNT precursors into the deposition chamber 506 during annealing of the substrate 508 and subsequent CNT growth thereon during the performance of the method 300. A mineral bubbler 526 may supply one or more inert gases (e.g., Argon gas) to the deposition chamber 506. Since the chemical vapor deposition apparatus 500 may be used to perform the remainder of the method 300 depicted in FIG. 3, reference will be made to the components depicted in FIG. 5 throughout the remaining description of the method 300.

Referring back to FIG. 3, in the block 304, the substrate 508 may be placed into the deposition chamber 506 and heated to the annealing temperature while exposed to an inert gas (e.g., from the mineral bubbler 526) to provide a catalyst nanoparticle distribution on a surface of the substrate 508. At block 306, prior to or during the heating of the substrate 508 to the annealing temperature or the maintenance of the substrate at the annealing temperature, the CNT catalyst is pre-treated via exposure to a CNT precursor at a first flow rate for an exposure period. It has been determined that such pre-treatments of the CNT catalyst facilitate the resultant CNTs having relatively low structural factors (e.g., less than or equal to 1.5).

In embodiments, to pre-treat the CNT catalyst, one or more of the valves 514 and 516 of the chemical vapor deposition apparatus 500 may be opened and the mass flow controllers 522 and 524 may be used to introduce the CNT precursor into the deposition chamber 506 at the first flow rate. In embodiments, the CNT precursor to which the CNT catalyst is exposed to during pre-treatment corresponds to the carbon source used during the process of growing the CNTs. For example, in embodiments, the CNT precursor to which the CNT catalyst is exposed during pre-treatment is $C_2H_4$. In embodiments, the exposure period of the pre-treatment corresponds to the annealing period at which the CNT catalyst is maintained at the annealing temperature at the block 304. In embodiments, the exposure period of the pre-treatment is less than the annealing period at which the CNT catalyst is maintained at the annealing temperature. For example, in embodiments, after the substrate 508 is heated to the annealing temperature, one of the valves 514 and 516 may be opened to expose the CNT catalyst to the CNT precursor. In embodiments, at least a portion of the exposure period during which the CNT catalyst is exposed to the CNT precursor during pre-treatment does not overlap with the annealing period. In embodiments, for example, at least a portion of the exposure period may occur prior to the CNT catalyst being heated to the annealing temperature (e.g., during heating of the substrate 508). In embodiments, the exposure period is greater than the annealing period.

In embodiments, the CNT precursor that the CNT catalyst is exposed to during pre-treatment comprises a carbon source (e.g., ethylene, methane) used during the CNT growth process. In embodiments, the flow rate at which the CNT precursor is introduced into the deposition chamber 506 is lower during pre-treatment than a flow rate at which the CNT precursor is subsequently introduced into the deposition chamber 506 during CNT growth. For example, in embodiments, the pre-treatment flow rate of the CNT precursor is at most one fourth of the flow rate at which the CNT precursor is subsequently introduced into the deposition chamber 506 during CNT growth. In embodiments, the pre-treatment flow rate of the CNT precursor is less than or equal to 5 sccm (e.g., less than or equal to 1 sccm, less than or equal to 0.7 sccm, less than or equal to 0.5 sccm). Such low flow-rates may beneficially inhibit pre-mature nucleation of the CNT catalyst nanoparticles and subsequent disruption of the CNT growth process.

Referring still to FIG. 3, at block 308, the CNT catalyst is exposed to CNT precursors for a growth period to produce a CNT array including a plurality of CNT bundles with an array height. For example, in embodiments, the valves 514 and 516 may be opened to introduce the CNT precursors from the CNT precursor sources 510 and 512 at predetermined flow rates via the mass flow controllers 522 and 524 for the growth periods. In embodiments, such exposure to the CNT precursors occurs while the substrate 508 is heated to the annealing temperature. In embodiments, the CNT growth occurs while the substrate 508 is heated to a temperature other than the annealing temperature. In embodiments, only a single CNT precursor is introduced into the deposition chamber 506 during the growth stage (e.g., a carbon source such as methane, ethylene, and the like). In embodiments, at least one additional gas such as $H_2$ is introduced into the deposition chamber 506 during CNT growth. The CNT precursors may decompose within the deposition chamber 506 and react with the CNT catalyst nanoparticles on the substrate 508, leading to activation thereof and nucleation of CNTs. After nucleation, subsequent carbon atoms may assemble on the nucleated CNTs to continue CNT growth, and growth may continue until a portion of the catalyst particles are deactivated such that aligned CNT growth cannot be sustained.

In embodiments, the growth period during which the pre-treated CNT catalyst is exposed to the CNT precursors is greater than or equal to 10 minutes (e.g., greater than or equal to 20 minutes, greater than or equal to 30 minutes, greater than or equal to 60 minutes). Generally, the longer the growth period, the greater the resultant CNT array height, provided that the CNT catalyst nanoparticles remain activated to facilitate aligned CNT growth. The composition of the substrate, the catalyst support layer, and the CNT catalyst, by effecting the distribution of CNT nanoparticles that may be activated during CNT growth, determine the period during which aligned CNT growth may be sustained.

In embodiments, the carbon source CNT precursor (e.g., $C_2H_4$) to which the substrate 508 is exposed during CNT growth corresponds to the CNT precursor used to pre-treat the substrate 508, but the flow rate at which the CNT precursor is introduced into the deposition chamber 506 is greater in the CNT growth step than in the CNT catalyst pre-treatment step (e.g., at least two times larger). In embodiments, the flow rate at which the carbon source CNT precursor is introduced into the deposition chamber 506 during CNT growth is greater than or equal to 5 sccm (e.g., greater than or equal to 10 sccm, greater than or equal to 20 sccm). Embodiments are envisioned where different carbon sources are utilized during pre-treatment of the CNT catalyst and exposure thereof during CNT growth.

As will be appreciated, various parameters of the method 300 (e.g., CNT catalyst, flow rates, temperatures, heating periods, and exposure periods) may be adjusted based on desired aspects (e.g., density, structural factor, alignment, CNT array height) of the CNT array being generated. The following examples were fabricated to assess the relationships between such parameters and the CNT arrays produced.

EXAMPLES

A first set of examples was fabricated on a 300 nm $SiO_2$ wafer having a 10 nm sputter-deposited (e.g., via the magnetron sputtering apparatus 400 depicted in FIG. 4A) $Al_2O_3$ catalyst support layer and 1 nm Fe CNT catalyst layer disposed thereon. The CNT catalyst pre-treatment step (the block 306 in the method 300 described with respect to FIG. 3) was not performed in these examples. The CNT catalyst was heated to a 775° C. annealing temperature and maintained at that temperature for 10 minutes prior to exposure to the CNT precursors for the growth period. The CNT precursors were $C_2H_4$ and $H_2$, with their flow rates being adjusted to determine flow rate dependencies. The length of the resultant CNTs (e.g., the CNT array height) were measured by image processing of SEM images of the CNT arrays. The results are provided below in Table 1.

TABLE 1

| Example | Pre-load | Anneal period (min) | Growth period (min) | Temp (C.) | $C_2H_4:H_2$ Rate (sccm) | CNT Height (μm) |
|---|---|---|---|---|---|---|
| 1 | 0 | 10 | 45 | 775 | 50:50 | 240 |
| 2 | 0 | 10 | 45 | 775 | 20:50 | 240 |
| 3 | 0 | 10 | 45 | 775 | 15:50 | 220 |
| 4 | 0 | 10 | 45 | 775 | 10:50 | 200 |
| 5 | 0 | 10 | 45 | 775 | 5:50 | 150 |

As shown, the longest CNT arrays resulted from the largest carbon source flow rates (e.g., 50 sccm and 20 sccm, respectively), which resulted in CNT array heights of 240 μm.

To determine effects of catalyst deposition methods, a second set of examples was fabricated on a similar substrate, catalyst support layer, and CNT catalyst, with the exception that the $Al_2O_3$ catalyst support layer was deposited on the substrate using e-beam evaporation (e.g., via the e-beam evaporation apparatus 412 depicted in FIG. 4B) instead of magnetron sputtering. In the second set of examples, the flow rate of $C_2H_4$ was maintained at 20 sccm, with the growth period being altered to determine growth period dependencies. The results are provided below Table 2

TABLE 2

| Example | Pre-load | Anneal Period (min) | Growth Period (min) | Temp (C.) | $C_2H_4:H_2$ Rate (sccm) | CNT Height (μm) |
|---|---|---|---|---|---|---|
| 6 | 0 | 10 | 15 | 775 | 20:50 | 800 |
| 7 | 0 | 10 | 30 | 775 | 20:50 | 1100 |
| 8 | 0 | 10 | 45 | 775 | 20:50 | 1300 |
| 9 | 0 | 10 | 60 | 775 | 20:50 | 1500 |
| 10 | 0 | 10 | 90 | 775 | 20:50 | 1100 |

As shown, the e-beam evaporated catalyst resulted in substantially greater CNT array heights, even with shorter growth periods (compare Example 2 to Example 6). When the growth period was 30 minutes or more, the resultant CNT array height was greater than or equal to 1 mm (e.g., 1100 μm, 1300 μm, and 1500 μm, respectively). Such a result indicates that that the method of depositing the CNT catalyst on the substrate may significantly impact the period for which the CNT catalyst nanoparticles may remain activated.

A third set of examples deposited CNTs on a similar substrate, catalyst support layer, and CNT catalyst as the second set of examples, but introduced CNT catalyst pre-treatments to determine the effects of the pre-treatments on the structural factors of the resultant CNT arrays. The pre-treatment flow rate at which CNT precursor ($C_2H_4$ in this example) was introduced into the deposition chamber remained constant at 0.5 sccm, but the exposure period varied between 0 and 30 minutes. The results are provided in Table 3 provided below.

Figure 6A:
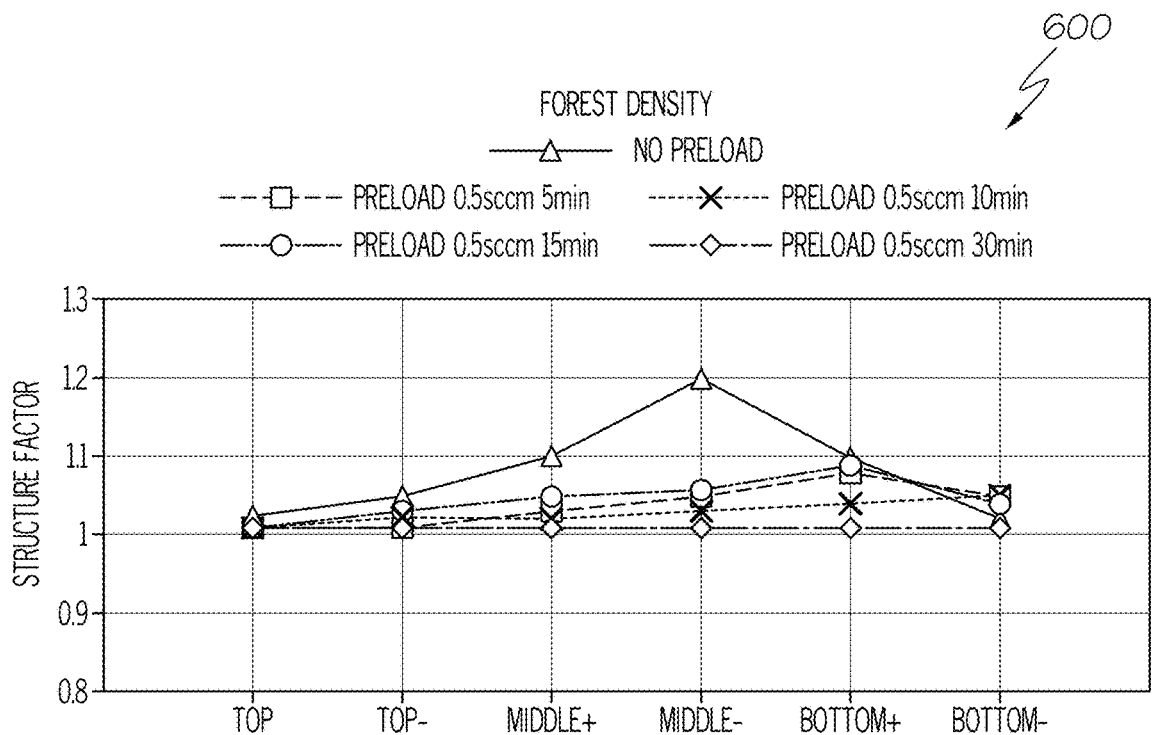
FIG. 6A depicts a plot of measured structural factors of a plurality of different CNT arrays, with each of the plurality of different CNT arrays being fabricating by pre-loading a CNT catalyst for a different exposure period, according to one or more embodiments described herein.

For each of examples 11-15, the structural factor of different lengthwise segments of the resulting CNT arrays were determined by analyses of scanning electron microscope images thereof (e.g., similar to the manner discussed above with respect to the FIGS. 2A-2H). FIG. 6A depicts a plot 600 of the structural factors of different lengthwise segments for different pre-treatment times. As shown, example 11, with no pre-treatment, has a structural factor that is highest in magnitude and variability, with the lengthwise segment just beneath the center of the CNT array (e.g., half way between the substrate and the ends of the CNTs) varying by approximately 20% from a minimum structural factor measured for a top segment of the CNT array. Example 15, in contrast, possess very little variability in terms of structural factor from the top to the bottom of the CNT array, indicating very low waviness in the resulting CNT array. The examples depicted in FIG. 6A that included CNT catalyst pre-treatment had lengthwise structural factor variability of less than or equal to 10% (e.g., and, in Examples 13 and 15, less than or equal to 5%) of a minimum measured structural factor.

Figure 6B:
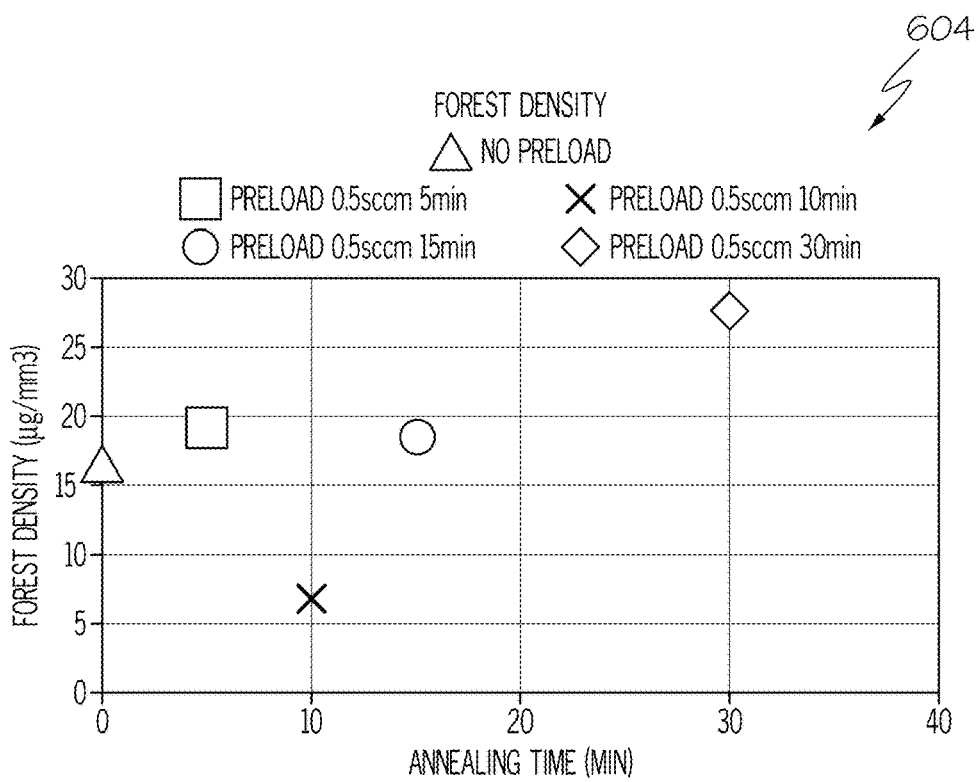
FIG. 6B depicts a plot of measured CNT densities for the plurality of CNT arrays described with respect to FIG. 6A, according to one or more embodiments described herein.

FIG. 6B depicts a plot 604 of CNT density for examples 11-15. As shown, example 15, with a pre-treatment exposure period of 30 minutes, resulted in a CNT density of greater than 25 μg/mm³, while example 11, with no pre-treatment, had a much smaller density of approximately 17 μg/mm³. As such, not only did the pre-treatments of the method 300 described herein result in an improved structural factor, but also improved the CNT yield. Without wishing to be bound by theory, the pre-treatments of the CNT catalyst described

TABLE 3

| Example | Pre-load Rate (sccm) | Pre-load treatment time(min) | Anneal Period (min) | Growth Period (min) | Temp (C.) | $C_2H_4:H_2$ Rate (sccm) | CNT Height (μm) | CNT Structural Factor |
|---|---|---|---|---|---|---|---|---|
| 11 | 0 | 0 | 10 | 60 | 775 | 20:50 | 1500 | 1.2 |
| 12 | 0.5 | 5 | 10 | 60 | 775 | 20:50 | 1500 | 1.2 |
| 13 | 0.5 | 10 | 10 | 60 | 775 | 20:50 | 800 | 1.05 |
| 14 | 0.5 | 15 | 10 | 60 | 775 | 20:50 | 1200 | 1.1 |
| 15 | 0.5 | 30 | 10 | 60 | 775 | 20:50 | 400 | 1.0 |

As shown, pre-treatment times of more than 5 minutes significantly reduced the resultant structural factor, with such examples having structural factors (e.g., measured as an average for a plurality of CNT bundles along the entirety of the lengths thereof) of less than or equal to 1.1. 30 minutes of pre-treating the CNT catalyst resulted in a structural factor of 1.0. Such reduced waviness of the resultant CNT array may result in the CNT array having improved material properties like thermal conductivity and tensile strength herein may facilitate a greater portion of CNT catalyst nanoparticles remaining activated during CNT growth, resulting in a denser growth network.

A fourth set of examples deposited CNTs on a similar substrate, catalyst support layer, and CNT catalyst as the third set of examples, but maintained the pre-treatment exposure period at 10 minutes. The flow rate at which the CNT precursor was introduced into the deposition chamber was varied between 0.5 sccm and 5.0 sccm during the pre-treatment of the CNT catalyst. The results are provided in Table 4 below.

TABLE 4

| Example | Pre-load Rate (sccm) | Pre-load treatment time(min) | Anneal Period (min) | Growth Period (min) | Temp (C.) | $C_2H_4:H_2$ Rate (sccm) | CNT Height (μm) | CNT Structural factor |
|---|---|---|---|---|---|---|---|---|
| 16 | 0.5 | 10 | 10 | 60 | 775 | 20:50 | 1100 | 1.1 |
| 17 | 0.7 | 10 | 10 | 60 | 775 | 20:50 | 1200 | 1.05 |
| 18 | 1 | 10 | 10 | 60 | 775 | 20:50 | 1100 | 1.2 |
| 19 | 5 | 10 | 10 | 60 | 775 | 20:50 | 800 | 1.2 |

As shown, Example 17, where the CNT precursor was introduced into the deposition chamber at a flow rate of 0.7 sccm for an exposure period of 10 minutes, resulted in a minimum average structural factor throughout the entirety of the length of the CNT array, and possessed the greatest CNT array height. The structural factor increases with increasing CNT catalyst pre-treatment flow rate after a period of 0.7 sccm, indicating some level of sensitivity of the structural factor to CNT precursor flow rate.

Figure 7A:
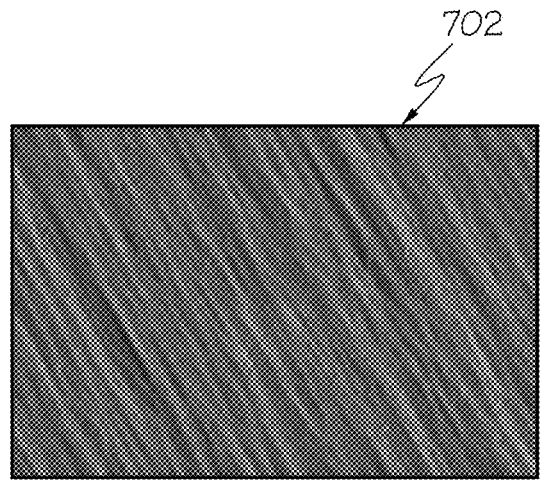
FIG. 7A depicts an image of a portion of a first CNT array fabricated using the method depicted in FIG. 3 with a CNT catalyst facing downward during CNT growth, according to one or more embodiments described herein.
Figure 7B:
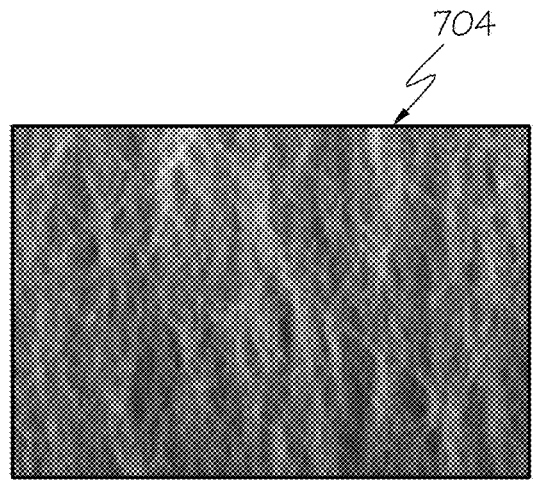
FIG. 7B depicts an image of a portion of a second CNT array fabricated using the method depicted in FIG. 3 with a CNT catalyst facing upward during CNT growth, according to one or more embodiments described herein.
Figure 7C:
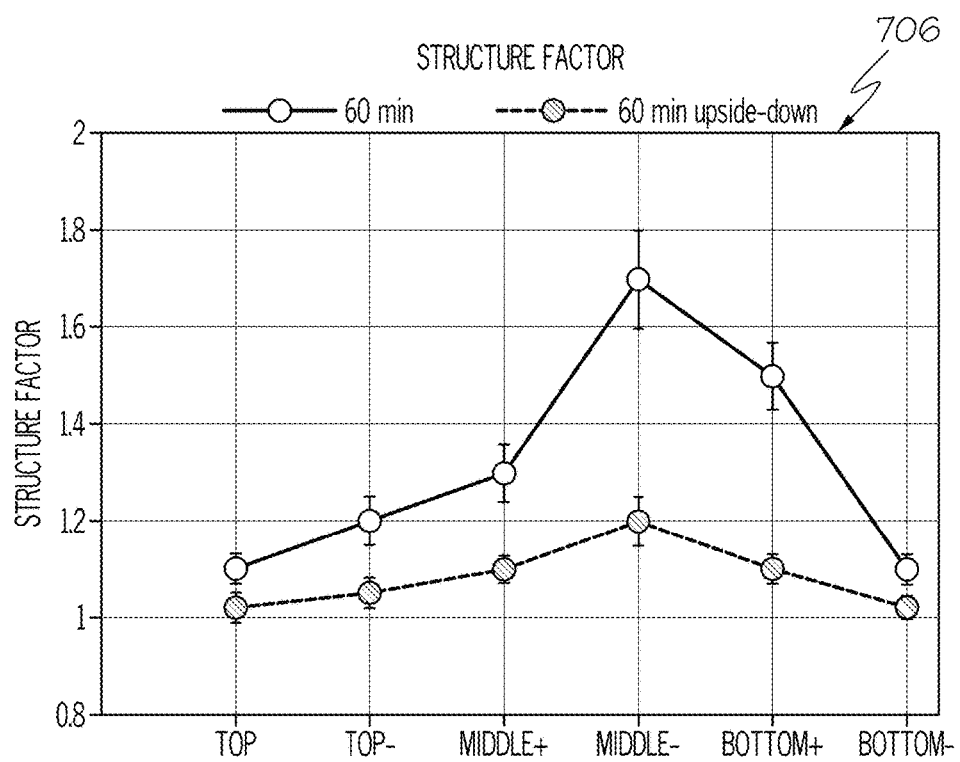
FIG. 7C depicts a plot of structural factors of lengthwise segments of CNT bundles of the first and second CNT arrays depicted in FIGS. 7A and 7B, according to one or more embodiments described herein.

In another set of examples, the orientation of the substrate within the deposition chamber was altered between an downward orientation (e.g., where a surface normal of the CNT catalyst extends in the same direction as gravity) and an upward orientation (e.g., where the surface normal of the CNT catalyst extends in the opposite direction as gravity) to determine any relationship to the resultant structural factor. FIG. 7A depicts an image of a first CNT array 702 resulting from performance of the method 300 with the CNT catalyst in the downward orientation. FIG. 7B depicts an image of a second CNT array 704 resulting from performance of the method 300 with the CNT catalyst in the upward orientation. The first and second CNT arrays 702 and 704 were fabricated on a similar substrate and catalyst as the fourth set of examples, with no CNT catalyst pre-treatments. FIG. 7C depicts a plot 706 of measured structural factors for a plurality of lengthwise segments of CNT bundles of the first and second CNT arrays 702 and 704 depicted in FIGS. 7A and 7B. As shown, the first CNT array 702, fabricated with the CNT catalyst in the downward orientation, possessed a uniformly higher structural factor than the second CNT array 704. Additionally, the structural factor varied by more than 33% throughout the thickness of the first CNT array 702. The structural factor of the second CNT array 704, in contrast, varied by less than 20% throughout the thickness thereof. Such results indicate than an upward orientation of the CNT catalyst during CNT growth facilitates generation of CNT arrays with reduced waviness.

Figure 8:
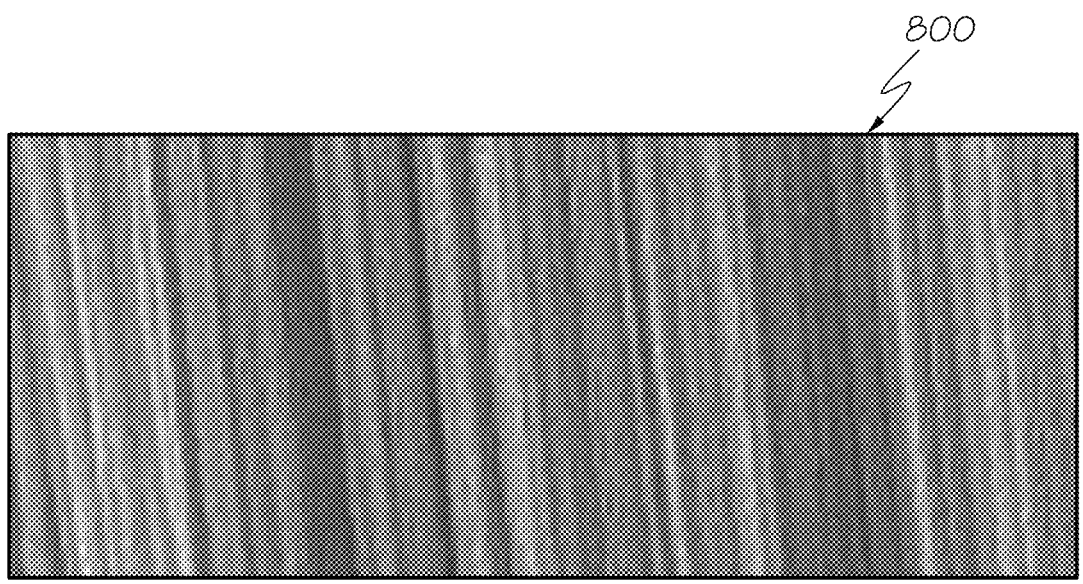
FIG. 8 depicts an image of a portion of a CNT array fabricated using the method depicted in FIG. 3, according to one or more embodiments described herein.

FIG. 8 depicts an image of a portion of a CNT array 800 associated with Example 17 herein. As described herein, the CNT array 800 had an overall average structural factor of 1.05, which is depicted by the relatively low levels of waviness of the CNTs. Moreover, as compared with any of the other CNT arrays depicted herein (e.g., the CNT array 100 depicted in FIG. 1, the CNT array 200 described with respect to FIGS. 2A-2H, the first and second CNT arrays 702 and 704 depicted in FIGS. 7A and 7B), the CNTs of the CNT array 800 possess a high level of alignment (i.e., each CNT extends substantially parallel to one another). Such conditions facilitate maintenance of CNT growth to produce CNT arrays possessing relatively high lengths (Example 17 had a CNT array height of 1.2 mm) and CNT densities. These results indicate that various parameters of CNT growth, including catalyst support layer and CNT catalyst deposition methods, CNT catalyst orientation during CNT growth, pre-treatment exposure periods and flow rates may be tuned to fabricate straight CNT arrays such as the CNT array 800 depicted in FIG. 8. CNT arrays possessing such alignment, straightness, length, and density may have favorable material properties (e.g., tensile strength and thermal conductivity) rendering them suitable for various applications.

It should now be understood that embodiments described herein are directed to CNT arrays possessing relatively low structural factors and methods for fabricating the same. Various parameters associated with CNT fabrication may be tailored to generate CNT arrays having low waviness (e.g., structural factors of less than or equal to 1.2 or even less than or equal to 1.1 or 1.05 throughout the entirety of the thickness of the CNT array), large CNT array heights (e.g., greater than or equal to 1.0 mm, greater than or equal to 1.2 mm, greater than or equal to 1.5 mm), and high CNT densities (e.g., greater than or equal to 15 µg/mm$^3$). For example, deposition of a catalyst support layer and CNT catalyst by e-beam evaporation may improve CNT array heights over embodiments where the catalyst support layer and/or CNT catalyst were deposed by magnetron sputtering. Pre-treatment of the CNT catalyst via exposure to a CNT precursor prior to CNT growth was found to be particularly effective at reducing CNT waviness, with structural factors of the CNT arrays approaching unity in some instances. Such straight CNTs may have improved thermal conductivities and tensile strengths, rendering them more favorable over existing CNTs for various applications (e.g., heat exchangers, fuel cells, and the like).

It is noted that the terms "substantially" and "about" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A method of fabricating a carbon nanotube ("CNT") array, the method comprising:
    providing a substrate with a CNT catalyst disposed on a surface of the substrate;
    heating the CNT catalyst to an annealing temperature;
    exposing the CNT catalyst to a CNT precursor for an exposure period to pre-load the CNT catalyst; and
    exposing the pre-loaded CNT catalyst to a carbon source for a growth period to form the CNT array, wherein:
        the CNT array comprises a plurality of CNT bundles that are aligned with one another in an alignment direction, and
        at least one of the plurality of bundles comprises an average structural factor of 1.5 or less along an entirety of the length thereof.

2. The method of claim 1, further comprising depositing the CNT catalyst on the substrate via electron beam-assisted physical vapor deposition.

3. The method of claim 2, further comprising forming a catalyst support layer directly on the surface of the substrate such that the CNT catalyst is deposited on the catalyst support layer, the catalyst support layer comprising a thickness that is greater than that of the CNT catalyst.

4. The method of claim 3, wherein the CNT catalyst comprises Fe.

5. The method of claim 3, wherein the catalyst support layer comprises $Al_2O_3$.

6. The method of claim 1, wherein the CNT array comprises a CNT array height in the alignment direction that is greater than or equal to 1.2 mm.

7. The method of claim 1, wherein the annealing temperature is greater than or equal to 750° C.

8. The method of claim 1, wherein a temperature of the CNT catalyst is maintained at the annealing temperature during the entirety of the exposure period.

9. The method of claim 1, wherein the exposure period is greater than or equal to 10 minutes and less than or equal to 30 minutes.

10. The method of claim 1, wherein the CNT precursor corresponds to the carbon source.

11. The method of claim 1, wherein the growth period is greater than or equal to 30 minutes and less than or equal 60 minutes.

12. The method of claim 1, wherein, during the exposure of the CNT catalyst to the carbon source, the substrate is oriented such that the CNT catalyst faces upward relative to gravity.

13. A method of fabricating a carbon nanotube ("CNT") array, the method comprising:
    inserting a CNT catalyst structure into a heating zone of a chemical vapor deposition ("CVD") chamber, the CNT catalyst structure comprising:
        a silicon substrate;
        a catalyst support layer disposed on the substrate; and
        a CNT catalyst layer disposed on the catalyst support layer;
    annealing the CNT catalyst layer to form a plurality of catalyst particles on the catalyst support layer by maintaining the CNT catalyst at an annealing temperature for an annealing period;
    during the annealing of the CNT catalyst, pre-loading the CNT by introducing a CNT precursor into the CVD chamber at a first flow rate for an exposure period; and
    after the pre-loading, exposing the CNT catalyst to the CNT precursor at a second flow rate for a growth period of at least 20 minutes, the second flow rate being greater than the first flow rate, wherein the exposure of the CNT catalyst to the CNT precursor at the second flow rate results in the formation of a plurality of CNT bundles having a structural factor of less than or equal to 1.5 throughout entireties of the length thereof.

14. The method of claim 13, wherein, during the exposure of the CNT catalyst to the CNT precursor, the substrate is oriented such that the CNT catalyst faces upward relative to gravity.

15. The method of claim 13, further comprising forming the catalyst support layer and the CNT catalyst layer on the substrate via electron beam-assisted physical vapor deposition.

16. The method of claim 13, wherein the catalyst support layer is constructed of $Al_2O_3$ and the CNT catalyst layer is constructed of Fe.

17. The method of claim 13, wherein the plurality of CNT bundles comprise a plurality of CNTs that are aligned with one another along an alignment direction and comprise a CNT array height along the alignment direction of greater than or equal to 1.2 mm.

18. A carbon nanotube (CNT) array comprising:
    a plurality of CNT bundles disposed on a substrate, wherein:
        the plurality of CNT bundles are aligned with one another in an alignment direction,
        ends of each of the plurality of CNT bundles are separated from one another by a CNT array height measured along the alignment direction, and
        each of the plurality of CNT bundles comprises a structural factor that is less than or equal to 1.5 along an entirety of a thickness of the CNT array.

19. The CNT array of claim 18, wherein the CNT array height is greater than or equal to 1.2 mm.

20. The CNT array of claim 18, wherein structural factors of a plurality of segments of each of the plurality of CNT bundles vary from one another by no more than 20% of a minimum structural factor for the plurality of CNT bundles.

\* \* \* \* \*

UNITED STATES PATENT AND TRADEMARK OFFICE
CERTIFICATE OF CORRECTION

PATENT NO. : 11,602,743 B2
APPLICATION NO. : 17/218345
DATED : March 14, 2023
INVENTOR(S) : Yuyang Song et al.

It is certified that error appears in the above-identified patent and that said Letters Patent is hereby corrected as shown below:

In the Specification

In Column 7, Line(s) 6, before "e-beam", delete "a" and insert --an--, therefor.

In Column 11, Line(s) 56, after "strength", insert --.--.

In Column 13, Line(s) 11, after "between", delete "an" and insert --a--, therefor.

In Column 13, Line(s) 35, delete "than" and insert --that--, therefor.

Signed and Sealed this
Thirtieth Day of May, 2023

Katherine Kelly Vidal
*Director of the United States Patent and Trademark Office*